US009130191B2

United States Patent
Jung et al.

(10) Patent No.: US 9,130,191 B2
(45) Date of Patent: Sep. 8, 2015

(54) DISPLAY PANEL, METHOD OF MANUFACTURING THE SAME, AND FRIT COMPOSITION USED IN THE DISPLAY PANEL

(75) Inventors: Sun-Young Jung, Suwon-si (KR); Jin-Hwan Jeon, Suwon-si (KR); Seung-Yong Song, Suwon-si (KR); Ji-Young Moon, Hwaseong-si (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 234 days.

(21) Appl. No.: 13/341,791

(22) Filed: Dec. 30, 2011

(65) Prior Publication Data

US 2012/0320502 A1    Dec. 20, 2012

(30) Foreign Application Priority Data

Jun. 17, 2011    (KR) .................. 10-2011-0059177

(51) Int. Cl.
| | | |
|---|---|---|
| *H01L 51/50* | (2006.01) | |
| *H01L 51/52* | (2006.01) | |
| *C03C 8/14* | (2006.01) | |
| *C03C 8/24* | (2006.01) | |

(52) U.S. Cl.
CPC .............. *H01L 51/5246* (2013.01); *C03C 8/14* (2013.01); *C03C 8/24* (2013.01); *H01L 2251/55* (2013.01)

(58) Field of Classification Search
CPC combination set(s) only.
See application file for complete search history.

(56) References Cited

U.S. PATENT DOCUMENTS

| 2005/0248270 | A1 | 11/2005 | Ghosh et al. | |
|---|---|---|---|---|
| 2009/0020617 | A1* | 1/2009 | Kwon et al. | 235/494 |
| 2009/0069164 | A1* | 3/2009 | Lamberson et al. | 501/15 |
| 2009/0260845 | A1* | 10/2009 | Kai et al. | 174/50.5 |
| 2010/0136484 | A1* | 6/2010 | Ito et al. | 430/286.1 |
| 2011/0091668 | A1* | 4/2011 | Lamberson et al. | 428/34 |

FOREIGN PATENT DOCUMENTS

| KR | 1020070078501 A | 8/2007 |
|---|---|---|
| KR | 1020070087167 A | 8/2007 |
| KR | 1020080041558 A | 5/2008 |

* cited by examiner

*Primary Examiner* — Mariceli Santiago
*Assistant Examiner* — Brenitra M Lee
(74) *Attorney, Agent, or Firm* — Knobbe Martens Olson & Bear LLP

(57) ABSTRACT

Provided are display panel, method of manufacturing the same, and frit composition used in the display panel. A display panel comprising: a first substrate, a second substrate facing the first substrate and a frit bonding the first substrate and the second substrate together, wherein the frit has an optical density of more than about 0.0683/μm for laser light of any one wavelength in a wavelength range of about 760 to about 860 nm.

11 Claims, 7 Drawing Sheets

DISPLAY PANEL, METHOD OF MANUFACTURING THE SAME, AND FRIT COMPOSITION USED IN THE DISPLAY PANEL

CROSS-REFERENCE TO RELATED APPLICATIONS

This application claims priority from Korean Patent Application No. 10-2011-0059177 filed on Jun. 17, 2011 in the Korean Intellectual Property Office, the disclosure of which is incorporated herein by reference in its entirety.

BACKGROUND

1. Field

The present embodiments relate to a display panel including a glass package sealed with a fit, a method of manufacturing the display panel, and a frit composition used in the display panel.

2. Description of the Related Technology

An organic light-emitting diode (OLED) display is a self-luminous display and includes an organic material between two electrodes. The OLED display emits light when injected electrons and holes recombine in the organic material.

Electrodes and an organic layer within an OLED display are readily damaged by interaction with oxygen and moisture that get into the OLED display. Thus, a frit is interposed between glass substrates to seal them and protect internal devices against oxygen and moisture.

To improve the sealing capability of a fit, an effective seal width of the frit should be increased. The effective seal width of the frit depends on how effectively the fit is heated and melted when upper and lower substrates are bonded together.

SUMMARY

Aspects of the present embodiments provide a display panel with a superior sealing capability.

Aspects of the present embodiments also provide a method of manufacturing a display panel with a superior sealing capability.

Aspects of the present embodiments also provide a frit composition with a superior sealing capability.

However, aspects of the present embodiments are not restricted to the one set forth herein. The above and other aspects of the present embodiments will become more apparent to one of ordinary skill in the art to which the present embodiments pertain by referencing the detailed description of the present embodiments given below.

According to an aspect of the present embodiments, there is provided

A display panel comprising:
a first substrate, a second substrate facing the first substrate and a frit bonding the first substrate and the second substrate together, wherein the frit has an optical density of more than about 0.0683/µm for laser light of any one wavelength in a wavelength range of about 760 to about 860 nm.

According to another aspect of the present embodiments, there is provided

A method of manufacturing a display panel, the method comprising:
preparing a first substrate and a second substrate, coating a frit composition, which has an optical density of more than about 0.0683/µm for laser light of a wavelength of 810 nm, on the second substrate, stacking the first substrate on the frit composition and sintering the fit composition by irradiating the laser light of the wavelength of 810 nm to the frit composition.

BRIEF DESCRIPTION OF THE DRAWINGS

The above and other aspects and features of the present embodiments will become more apparent by describing in detail example embodiments thereof with reference to the attached drawings, in which.

DETAILED DESCRIPTION

The present embodiments will now be described more fully hereinafter with reference to the accompanying drawings, in which preferred embodiments are shown. The present embodiments may, however, be embodied in different forms and should not be construed as limited to the embodiments set forth herein. Rather, these embodiments are provided so that this disclosure will be thorough and complete, and will fully convey the scope of the embodiments to those skilled in the art. The same reference numbers indicate the same components throughout the specification. In the attached figures, the thickness of layers and regions is exaggerated for clarity.

Unless defined otherwise, all technical and scientific terms used herein have the same meaning as commonly understood by one of ordinary skill in the art to which these embodiments belong. It is noted that the use of any and all examples, or example terms provided herein is intended merely to better illuminate the embodiments and is not a limitation on the scope of the embodiments unless otherwise specified. Further, unless defined otherwise, all terms defined in generally used dictionaries may not be overly interpreted.

Figure 1:
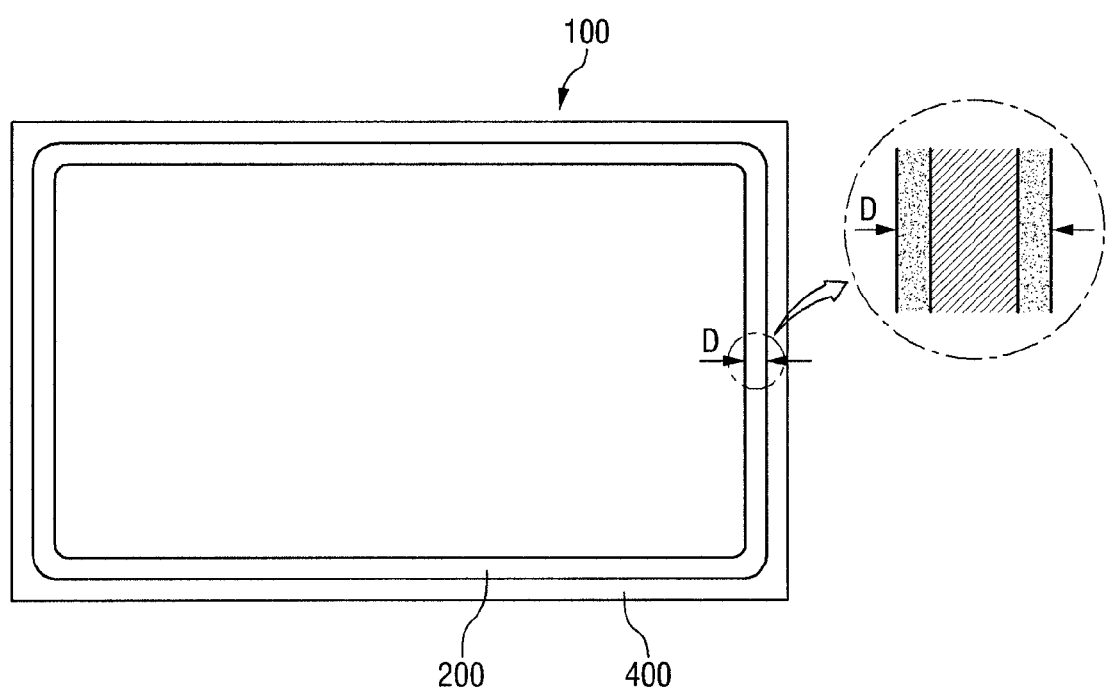
FIG. 1 is a schematic layout view of a display panel according to an example embodiment.
Figure 2:
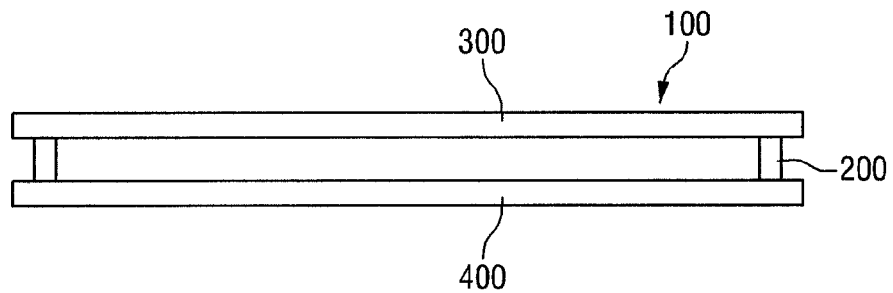
FIG. 2 is a cross-sectional view of the display panel shown in FIG. 1.

FIG. 1 is a schematic layout view of a display panel 100 according to an example embodiment. FIG. 2 is a cross-sectional view of the display panel 100 shown in FIG. 1.

Referring to FIGS. 1 and 2, the display panel 100 includes a first substrate 400, a second substrate 300, and a frit 200 interposed between the first substrate 400 and the second substrate 300.

The first substrate 400 may be made of a glass material such as borosilicate glass, soda-lime glass, or a mixture of the same. However, the present embodiments are not limited thereto.

The first substrate 400 may receive thermal stress from a heating member (such as a laser) used in the process of attaching the frit 200 to the first substrate 400. Thus, the first substrate 400 may be made of a material that hardly absorbs a wavelength range corresponding to thermal energy generated from the heating member.

A plurality of micro devices for light emission may be formed on the first substrate 400. For example, a plurality of light-emitting units may be formed on the first substrate 400. Here, the light-emitting units may be organic light-emitting diodes (OLEDs), and each of the OLEDs may have a stacked structure of a cathode electrode which provides electrons, an electron injecting layer which transports the electrons provided by the cathode electrode, an organic emitting layer which emits light when transported electrons and holes react with each other to excite organic molecules, a hole injecting layer which transports holes provided by an anode electrode, and the anode electrode which provides the holes.

A plurality of thin-film transistors (TFTs) may further be formed on the first substrate 400. When a light-emitting unit includes an OLED, a TFT may be connected to at least one of the cathode electrode and the anode electrode of the OLED to control the provision of current to the connected one or ones of the cathode electrode and the anode electrode.

The second substrate 300 faces the first substrate 400 and covers the light-emitting units located on the first substrate 400. Like the first substrate 400, the second substrate 300 may be made of a glass material such as borosilicate glass, soda-lime glass, or a mixture of the same. In addition, like the first substrate 400, the second substrate 300 may be made of a material that hardly absorbs the wavelength range corresponding to the thermal energy generated from the heating member.

The frit 200 is interposed between the first substrate 400 and the second substrate 300 and provides a sealed space between the first substrate 400 and the second substrate 300. To provide a sufficiently large sealed space in a central region of the first and second substrates 400 and 300, the frit 200 may be formed in peripheral regions thereof. The fit 200 may be formed by sintering a fit composition.

To fully seal a display region from the outside environment with the frit 200, a seal width of the frit 200 should be large enough to become an effective seal width. Here, the seal width may denote a width which enables the fit 200 to connect the frit substrate 400 and the second substrate 300 after being melted by thermal energy it absorbs and then sintered and which enables the frit 200 to block outside air and moisture. The seal width will now be described in greater detail with reference to FIGS. 3A and 3B.

Figure 3A:
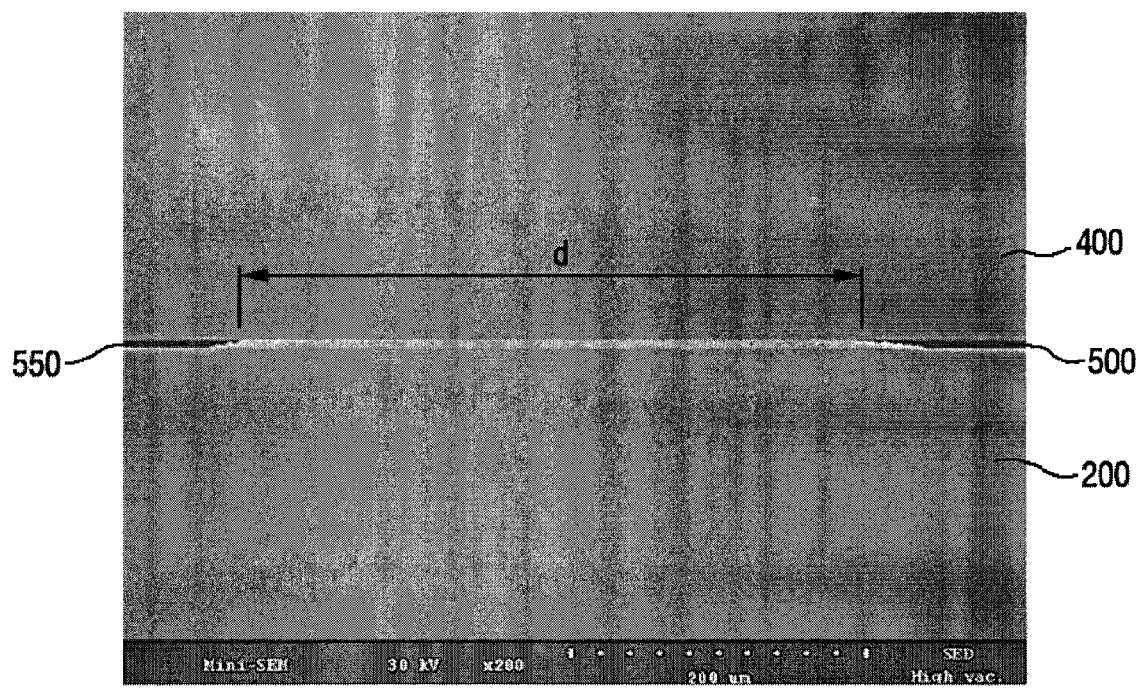
FIG. 3A is a scanning electron microscope (SEM) photograph of a frit.
Figure 3B:
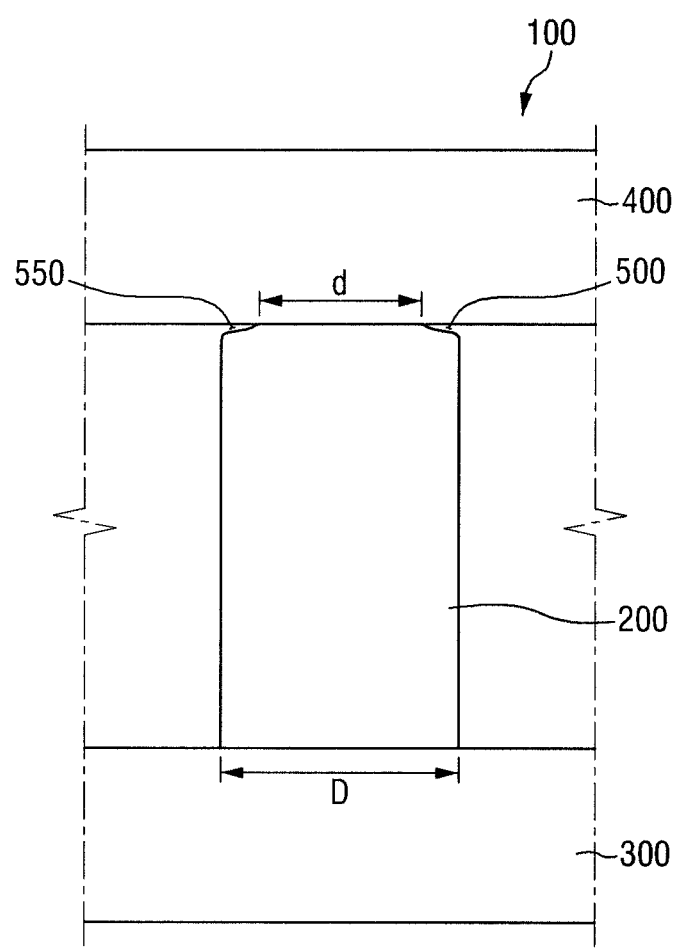
FIG. 3B is a schematic diagram illustrating a seal width of the fit of FIG. 3A.

FIG. 3A is a scanning electron microscope (SEM) photograph of the frit 200. FIG. 3B is a schematic diagram illustrating the seal width of the frit 200 of FIG. 3A. Referring to FIGS. 3A and 3B, a width of the frit 200 attached onto the first and second substrates 400 and 300 is not always equal to a width D of the entire fit 200. As shown in FIG. 3B, a width of the frit 200 in a region in which the fit 200 is attached onto the second substrate 300 to contact the second substrate 300 is equal to the maximum width D of the frit 200. However, a width d of the frit 200 in a region in which the fit 200 is attached onto the first substrate 400 to contact the first substrate 400 may be smaller than the maximum width D of the frit 200 due to empty spaces 500 and 550 at edges of the fit 200. In this case, a width that contributes to sealing the display panel 100 from outside air and moisture is the width d of the frit 200 attached onto the first substrate 400. Accordingly, the seal width is determined to be the width d of the frit 200 actually attached onto the first substrate 400, excluding the edges of the frit 200 (e.g., the empty spaces 500 and 550) which are not connected to the first substrate 400.

Unlike in the example illustrated in FIGS. 3A and 3B, the width of the fit 200 attached onto the first substrate 400 may also be smaller than the width D of the entire fit 200. In this case, a smaller one of the width of the fit 200 attached onto the first substrate 400 and the width of the frit 200 attached onto the second substrate 300 is determined to the seal width.

The effective seal width may denote a seal width large enough to enable the fit 200 to connect the first substrate 400 and the second substrate 300 and block outside air and moisture. For example, when a ratio of a seal width to the maximum width D of the frit 200 is about 0.7 or higher, it can be determined that the effective seal width has been formed. Specifically, when the maximum width D of the frit 200 is 600 μm, if a seal width that enables the fit 200 to block outside air and moisture is 420 μm or more, it can be determined that the effective seal width has been formed. Likewise, when the maximum width D of the fit 200 is 1200 μm, a seal width of 840 μm or more may be determined to be the effective seal width.

The seal width of the frit 200 may be symmetrical with respect to a center line of the fit 200. However, the seal width may also be in various forms.

After materials that form the frit 200 are heated using the heating member, some of the materials that form the fit 200 may not be properly sintered into the frit 200. The materials that are not properly sintered do not contribute to the sealing of the display panel 100. A seal width formed large enough to exceed the effective seal width through a smooth sintering process is closely related to the degree of sealing of the display panel 100.

To increase the effective seal width of the frit 200, it is desirable for the frit 200 to fully absorb thermal energy from the heating member. For example, the use of a frit having a high optical density, which indicates the degree of absorption of radiant energy, is advantageous to the sealing of the display panel 100. The heating member may be laser light of any one wavelength in a wavelength range of 760 to 860 nm.

The optical density may also be referred to as an extinction coefficient and may be measured in [/μm]. Absorbance and extinction coefficient may satisfy the following equations.

$$\text{Absorbance} = A = \log(1/t) = \log(1/(It/Io)) = -\log(It/100) = \epsilon CL,$$

$$\text{Extinction coefficient} = A/L = \epsilon C,$$

where t=It/Io represents the intensity of transmitted light/the intensity of incident light (the incident light: 100%, the transmitted light: measured transmittance (%)), ε represents a proportional constant, C represents the concentration of a sample (it is assumed that the concentration of the sample is constant), and L represents the length (thickness) of the sample.

When the transmittance of a sample for laser light of any one wavelength in a wavelength range of about 760 to about 860 nm, for example, laser light of 810 nm is 20%, if the sample has a thickness of 5 μm, A (absorbance)=−log(20/100)=0.69897, and A/L=εC (extinction coefficient)=0.69897/5 μm=0.139794/μm.

Hereinafter, an optical density range that ensures superior sealing performance of the frit 200 and methods of achieving optical densities in this optical density range will be described.

In a frit-sintering process using a laser, an optical density of a fit determines a seal width of the frit. If a minimum optical density for forming an effective seal width can be identified, the time required to select materials that form the frit can be reduced based on the identification result, which, in turn, reduces the entire frit process. An optical density that allows a frit to have an effective seal width after being irradiated with laser light of 810 nm varies according to characteristics of mother glass or other components of the frit. Components of a frit and a minimum optical density of the frit will hereinafter be described in detail.

A fit may include mother glass and ceramic filler. In some embodiments, the mother glass may be vanadium-based mother glass including a plurality of compounds. For example, the vanadium-based mother glass may include about 40 to about 50% by mole of $V_2O_5$, which is a vanadium-based compound, based on the total content of the fit and may further include $TeO_2$, BaO, and ZnO.

The ceramic filler is distributed within the mother glass to maintain the shape of the sintered frit. In addition, the ceramic filler controls a coefficient of thermal expansion (CTE) of the frit to maintain the mechanical strength of the frit. More specifically, the ceramic filler may be made of a material having a relatively lower CTE than the mother glass. Therefore, even when the mother glass has a relatively high CTE, since the CTE of the mother glass is offset by the CTE of the ceramic filler, the CTE of the frit can be maintained low. A lower CTE increases mechanical strength against heat. Therefore, the ceramic filler contributes to an increase in the mechanical strength of the frit. When the vanadium-based mother glass is used as the mother glass, the ceramic filler mixed with the vanadium-based mother glass may be, e.g., $Zr_2(WO_4)(PO_4)_2$.

As verified through experimental examples which will be described later, a vanadium-based frit should have an optical density of more than about $0.0683/\mu m$ in order to have an effective seal width after being irradiated with laser light of any one wavelength in a wavelength range of about 760 to about 860 nm, for example, laser light of 810 nm. An upper limit of the optical density of the frit may be $0.2/\mu m$. An optical density of $0.2/\mu m$ or less can prevent sintering defects at each frit height due to a reduction in the transmittance of laser light.

The content of a vanadium-based component in the vanadium-based fit may change the optical density of the frit. Specifically, the vanadium-based component may be, e.g., $V_2O_5$. When the content of $V_2O_5$ in the vanadium-based fit is about 40 to about 50% by mole, a high optical density can be obtained. In some other embodiments, the vanadium-based fit may further include $V_2O_4$. In this case, the sum of the content of $V_2O_4$ and the content of $V_2O_5$ may be about 40 to about 50% by mole. Since $V_2O_4$ is more brownish in color than $V_2O_5$, a greater content of $V_2O_4$ may lead to a higher absorption rate of thermal energy, thereby increasing the optical density of the vanadium-based frit.

In order to increase the content of $V_2O_4$ in the fit, a fit composition may be plasticized in a $N_2$ atmosphere. Specifically, the vanadium-based mother glass that contains $V_2O_5$ is yellowish due to a vanadium component of a pentavalent ion. If a vanadium-based compound has a chemical reaction in a $N_2$ environment, $VO_2$ is contained in the resultant compound. The chemical reaction formula of the vanadium-based mother glass in the $N_2$ environment is as follows.

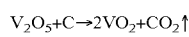

$$V_2O_5 + C \rightarrow 2VO_2 + CO_2 \uparrow$$

Therefore, the resultant compound includes a vanadium component of a tetravalent ion, and vanadium of the tetravalent ion is brownish in color. This corresponds to a condition that increases the frit's absorption rate of thermal energy, thus increasing the optical density of the frit.

During the process of plasticizing the frit, a flow rate of oxygen in a workspace should be maintained at a predetermined rate or higher in order to induce a desired chemical reaction. Therefore, the flow rate of $N_2$ in the workspace for the plasticizing process needs to be adjusted in view of the flow rate of oxygen in the workspace. For example, the flow rate of $N_2$ in the workspace for the plasticizing process may be 30 to 40% by volume.

In some other embodiments, the mother glass of the frit may be bismuth-based mother glass including a plurality of compounds. The bismuth-based glass may include 30 to 45% by mole of $Bi_2O_3$ based on the total content of the fit and may further include ZnO, $B_2O_3$, BaO, $Al_2O_3$, $SiO_2$, and MgO. Here, the ceramic filler that can be mixed with the bismuth-based mother glass may be, e.g., $Mg_2(Al_4O_3(SiO_3)_5))$.

As verified through the experimental examples which will be described later, a bismuth-based frit should have an optical density of more than about $0.1567/\mu m$ or more in order to have an effective seal width after being irradiated with laser light of any one wavelength in a wavelength range of about 760 to about 860 nm, for example, laser light of 810 nm. The reason why the bismuth-based frit requires a higher optical density than the vanadium-based frit is that its material characteristics such as the color of its mother glass are different from those of the vanadium-based frit and, accordingly, it requires a different amount of thermal energy.

The bismuth-based fit may further include a pigment in order to increase its optical density. The pigment added to the frit can change the color of the entire frit. Since the bismuth-based glass is whitish due to properties of bismuth, it is not efficient in absorbing energy provided by the heating member. For this reason, a pigment may be added to the bismuth-based mother glass to change the color of the frit, so that the frit can better absorb radiant energy. When a Mn-containing pigment is added to the frit, the optical density of the frit is increased compared with when not added. Accordingly, the increased optical density of the frit may increase the effective seal width of the frit. Here, the Mn-containing pigment may be one or more materials selected from the group consisting of MnO, $MnO_2$ and $Mn_3O_4$. For example, $Mn_3O_4$ added to the frit significantly increases the optical density of the frit, which, in turn, ensures a sufficiently large effective seal width.

An increase in the content of the Mn-containing pigment in the bismuth-based frit leads to an increase in the optical density of the frit, resulting in an increase in the effective seal width of the frit. From this perspective, the content of the Mn-containing pigment in the entire fit should be 9.9% by mole or more. To prevent sintering defects at each frit height due to a reduction in the transmittance of laser light, the content of the Mn-containing pigment in the entire frit should be 11.01% by mole.

In some embodiments, the addition of a pigment to the fit may induce melanization of the fit. The melanized frit can better absorb thermal energy. Therefore, the pigment added to the fit increases the absorption rate of energy generated from a laser. The increased absorption rate of energy increases the optical density of the frit, thus increasing the effective seal width of the frit. A pigment can be added directly to the mother glass or can be added to the fit as an additional component, in addition to the mother glass and the filler.

The Mn-containing pigment can be added directly to the mother glass or can be added as an additional component, in addition to the mother glass and the filler. An excessive increase in Mn content in the mother glass may degrade unique characteristics of the mother glass. Specifically, the mother glass, which is a glass component, has a certain flow when melted at an appropriate temperature. However, if the content of Mn in the mother glass exceeds a predetermined value, the flow of the mother glass changes, making it difficult to sinter the fit. Therefore, the amount of the Mn-containing pigment added directly to the mother glass may be limited to a predetermined amount. From this perspective, one or more materials selected from the group consisting of MnO, $MnO_2$ and $Mn_3O_4$ may be added to the mother glass in an amount of 0.1 to 2% by mole based on the total content of the fit, and other components may be added to the mother glass as pigments separate from the mother glass.

A pigment containing one or more materials selected from the group consisting of MnO, $MnO_2$ and $Mn_3O_4$ may be added not only to the fit based on the bismuth-based mother glass but also to the frit based on the vanadium-based mother glass.

Figure 4:
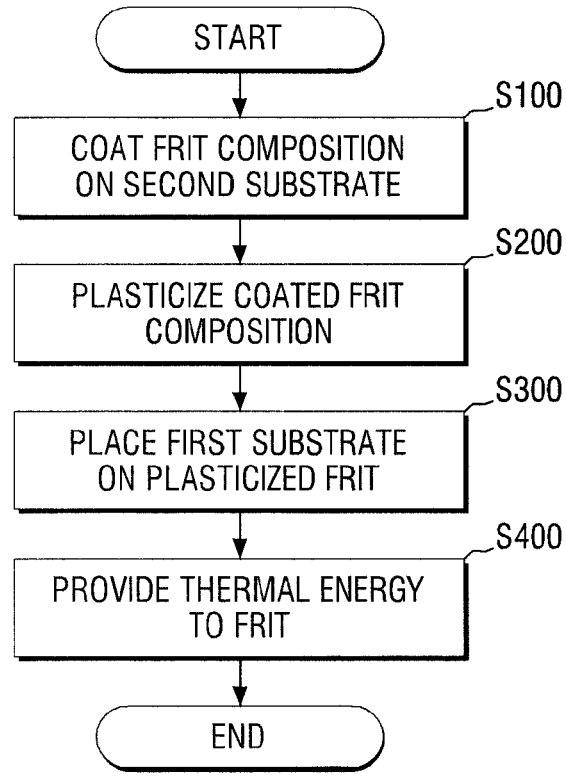
FIG. 4 is a flowchart illustrating a method of manufacturing a display panel according to an example embodiment.

Hereinafter, a method of manufacturing a display panel according to an example embodiment will be described. FIG. 4 is a flowchart illustrating a method of manufacturing a display panel according to an example embodiment.

Referring to FIGS. 1, 2 and 4, a fit composition is coated on a second substrate 300 (operation S100). The frit composition may be coated not on a first substrate 400 on which light-emitting units are disposed but on the second substrate 300 which covers the light-emitting units. In some cases, the frit composition may be coated on the first substrate 400. The fit composition may be coated on the second substrate 300 using, but not limited to, a screen printing method. The frit composition coated on the second substrate 300 may be gel-state paste formed by adding oxide powder and an organic material to glass powder.

The coated frit composition is plasticized (operation S200). To attach the gel-state frit paste onto the second substrate 300 as a solid-state frit 200, the frit composition is plasticized in a workspace such as a chamber. If the fit composition is a vanadium-based fit composition, the workspace may be put in a $N_2$ environment. Here, a flow rate of $N_2$ in the workspace may be 30 to 40% by volume or less.

The plasticizing temperature may be in a range of from about 300 to about 500° C., preferably, about 400° C. In this plasticizing process, the organic material dissipates into the air, and the gel-state paste hardens to be attached onto the second substrate 300 as the solid-state frit 200.

The first substrate 400 is placed on the plasticized frit 200 (operation S300). The first substrate 400 having the light-emitting units on a surface thereof is placed to face the second substrate 300 having the frit 200 attached thereto.

Finally, thermal energy is provided to the fit 200 using a heating member (operation S400). The heating member may be laser light of any one wavelength in a wavelength range of about 760 to about 860 nm, for example, laser light of 810 nm. Laser irradiation may be performed with a power of about 12.5 to about 13.0 W. After the first substrate 400 is placed on the fit 200, laser light of 810 nm may be irradiated to a display panel 100. Accordingly, the fit 200 is melted and attached to the first substrate 400, thereby bonding the first substrate 400 and the second substrate 300 together. Here, if the frit 200 has an optical density of 0.0683/μm or greater, a sufficient large effective seal width can be formed as described above. Therefore, when the first substrate 400 and the second substrate 300 are attached to each other by this fit 200, oxygen and moisture can be prevented from getting into a pixel region.

The present embodiments will now be described in further detail with reference to the following experimental examples. Information not provided below can be readily inferred by those of ordinary skill in the art, and thus a description thereof will be omitted.

EXPERIMENTAL EXAMPLE 1

Figure 5:
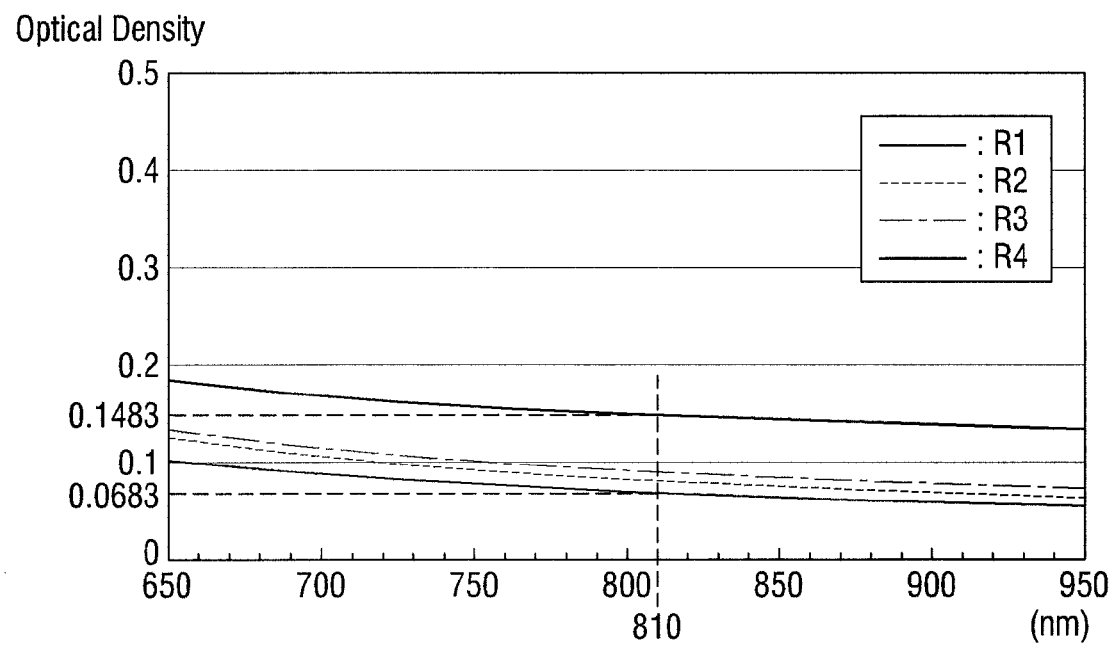
FIG. 5 is a graph illustrating the relationship between the content of a vanadium compound in a vanadium-based fit and the optical density of the vanadium-based frit.

Relationship Between the Optical Density and Seal Width of a Vanadium-based Frit Four frit samples R1 through R4 having different optical densities were prepared by adjusting the content of vanadium in a frit. Vanadium content in the frit samples R1 through R4 satisfied R1<R2<R3<R4. As shown in FIG. 5, the vanadium content in each of the first samples R1 through R4 was adjusted such that R1 had an optical density of 0.0683/μm, R2 had an optical density of 0.0795/μm, R3 had an optical density of 0.0892/μm and R4 had an optical density of 0.1483/μm for laser light of 810 nm.

Each of the fit samples R1 through R4 was coated to a width of 600 μm, and laser light of 810 nm and with an energy of 12.5 W was irradiated. However, since a seal width was not formed at all in the case of R1, the energy of the laser light was increased to 15.5 W, and then the experiment was conducted again. The results are shown in Table 1 and FIGS. 5 and 6. In Table 1, it is determined that an effective seal width has been formed when a ratio of a seal width to a fit width is 0.7 or higher.

TABLE 1

| Sample | Optical density (/μm) | Seal width of frit (μm) | Seal width/frit width | Formation of effective seal width |
|---|---|---|---|---|
| R1 | 0.0683 | 369 | 0.615 | X |
| R2 | 0.0795 | 476 | 0.793 | ◯ |
| R3 | 0.0892 | 491 | 0.818 | ◯ |
| R4 | 0.1483 | 505 | 0.842 | ◯ |

Figure 6:
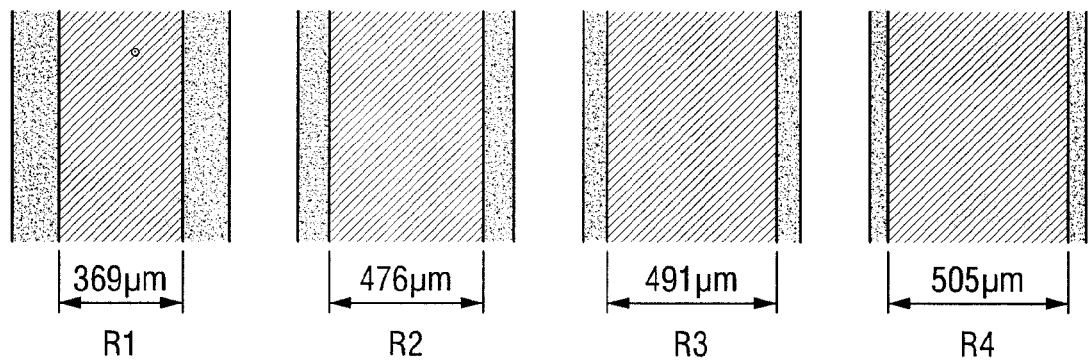
FIG. 6 is a diagram illustrating a seal width of each sample of FIG. 5.

Referring to Table 1 and FIGS. 5 and 6, the effective seal width was not formed in the case of R1 although the energy of the laser light was significantly increased. On the other hand, a sufficiently large effective seal width was formed in the case of R2 and R4, even with an energy of 12.5 W, and R4 had a largest seal width. A higher optical density led to a greater seal width.

It can be understood from the above results that a vanadium-based frit can have an effective seal width only when its optical density exceeds 0.0683/μm.

EXPERIMENTAL EXAMPLE 2

Relationship Between the Optical Density and Seal Width of a Bismuth-based Fit with or without a Mn—Containing Pigment A frit sample P1 was prepared without adding a $Mn_3O_4$-containing pigment to a bismuth-based fit, and another fit sample P2 was prepared by adding the $Mn_3O_4$-containing pigment to the bismuth-based frit. Then, optical densities of the frit samples P1 and P2 were measured for laser light of 810 nm. The frit samples P1 and P2 were coated to a width of 600 μm, and laser light of 810 nm and with an energy of 12.5 W was irradiated. Then, seal widths of the frit samples P1 and P2 were measured, and the results are shown in Table 2 and FIGS. 7 and 8.

TABLE 2

| Sample | Optical density (/μm) | Seal width of frit (μm) | Seal width/frit width | Formation of effective seal width |
|---|---|---|---|---|
| P1 | 0.0615 | 0 | 0 | X |
| P2 | 0.1732 | 467 | 0.778 | ○ |

Figure 7:
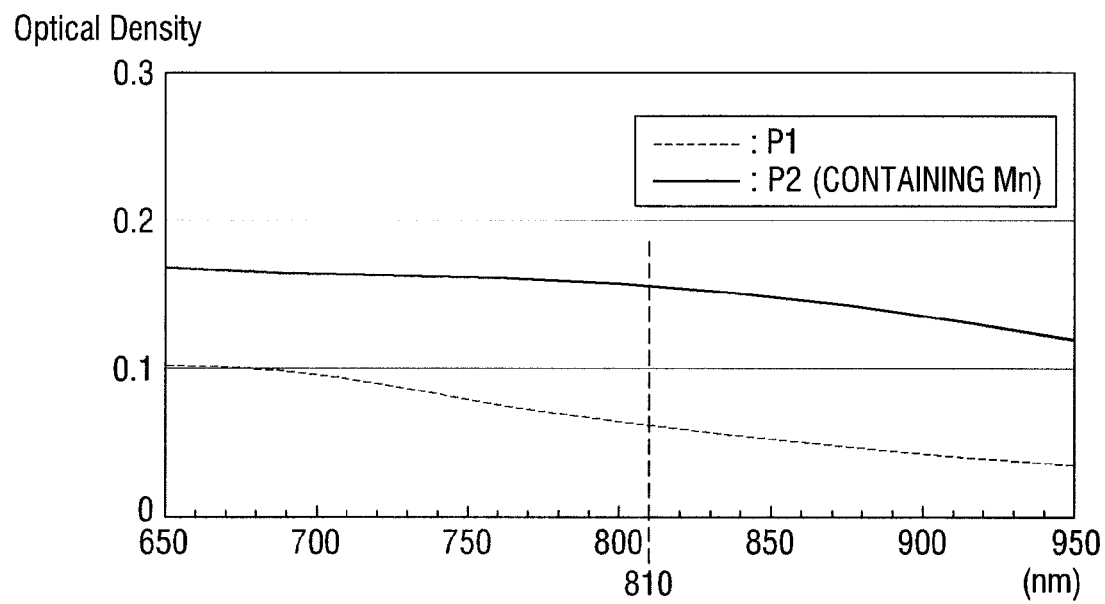
FIG. 7 is a graph illustrating the relationship between the type of a pigment contained in a bismuth-based fit and the optical density of the bismuth-based frit.
Figure 8:
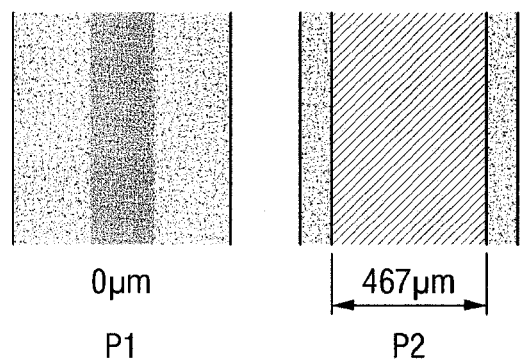
FIG. 8 is a diagram illustrating a seal width of each sample of FIG. 7.

Referring to Table 2 and FIGS. 7 and 8, the measured optical density of the frit sample P1 without the $Mn_3O_4$-containing pigment was only 0.0615/μm, while the measured optical density of the frit sample P2 with the $Mn_3O_4$-containing pigment was 0.1732/μm. The frit sample P2 had a far higher optical density than the frit sample P1. Referring to Table 2 and FIG. 7, a seal width was not formed at all in the case of P1. On the other hand, the seal width of the frit sample P2 having the $Mn_3O_4$-containing pigment was 467 μm, thus securing a sufficiently large seal width.

It can be understood from the above results that the addition of a $Mn_3O_4$-containing pigment to a frit increases the optical density of a frit, thus ensuring a sufficiently large effective seal width.

EXPERIMENTAL EXAMPLE 3

Seal Width of a Bismuth-based Fit According to Mn Content in the Bismuth-Based Fit Three fit samples D1 through D3 having different optical densities were prepared by adjusting the content of a $Mn_3O_4$-containing pigment in a bismuth-based fit. As shown in Table 3, the content of $Mn_3O_4$ in mother glass was 0.5% by mole in the case of D1, 1.0% by mole in the case of D2, and 2.0% by mole in the case of D3. In addition to the mother glass, 8 to 9% by mole of the $Mn_3O_4$-containing pigment was added to each of the frit samples D1 through D3.

Each of the frit samples D1 through D3 was coated to a width of 600 μm, and laser light of 810 nm and with an energy of 12.5 W was irradiated. Then, seal widths of the fit samples D1 through D3 were measured. The results are shown in Table 3 and FIGS. 9 and 10.

TABLE 3

| Sample | Mn content in mother glass (mol %) | Seal width of frit (μm) | Seal width/frit width | Formation of effective seal width |
|---|---|---|---|---|
| D1 | 0.5 | 450 | 0.750 | ○ |
| D2 | 1.0 | 478 | 0.797 | ○ |
| D3 | 2.0 | 498 | 0.830 | ○ |

Figure 9:
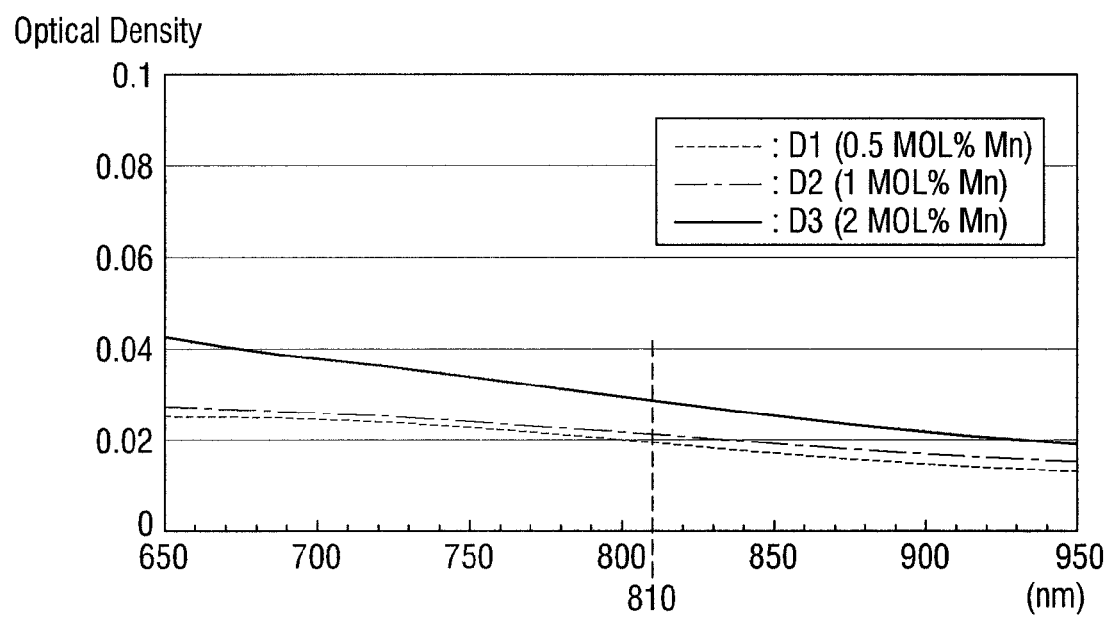
FIG. 9 is a graph illustrating the relationship between the content of Mn in a frit having a Mn-containing pigment and the optical density of the frit.
Figure 10:
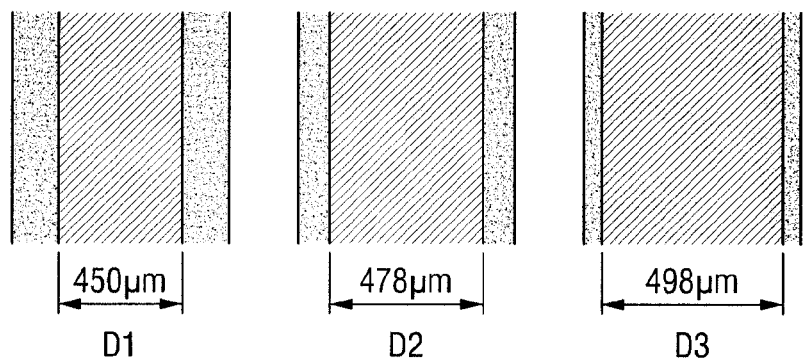
FIG. 10 is a diagram illustrating an effective seal width of each sample of FIG. 9.

Referring to Table 3 and FIGS. 9 and 10, a greater content of $Mn_3O_4$ in a frit led to a greater seal width of the fit. In addition, an effective seal width was formed in all of the frit samples D1 through D3.

It can be understood from the above results that it is desirable to increase the content of $Mn_3O_4$ in order to increase the effective seal width of a frit.

EXPERIMENTAL EXAMPLE 4

Optical Density Range of a Bismuth-Based Frit for Laser Sealing

To find out an optical density range for laser sealing, experiments were conducted by varying a method of adding a $Mn_3O_4$-containing pigment to a bismuth-based frit.

A 'Bi mother glass' sample was prepared without adding the $Mn_3O_4$-containing pigment to a frit, and a 'Bi Black mother glass' sample was prepared by adding the $Mn_3O_4$-containing pigment only to mother glass. In addition, a 'Bi Black mother glass+pigment' sample was prepared by adding the $Mn_3O_4$-containing pigment not only to the mother glass but also to the frit.

Each fit sample was irradiated with laser light of 810 nm and with an energy of 12.5 W to see if it had an effective seal width. The results are shown in Table 4 and FIG. 11.

TABLE 4

| Sample | Optical density (/μm) | Formation of effective seal width |
|---|---|---|
| Bi mother glass | 0.0162 | Not formed |
| Bi Black mother glass | 0.0284 | Not formed |
| Bi mother glass + pigment | 0.1004 | Not formed although a seal width for connecting both substrates was formed |
| Bi Black mother glass + pigment | 0.1567 | Formed |

Figure 11:
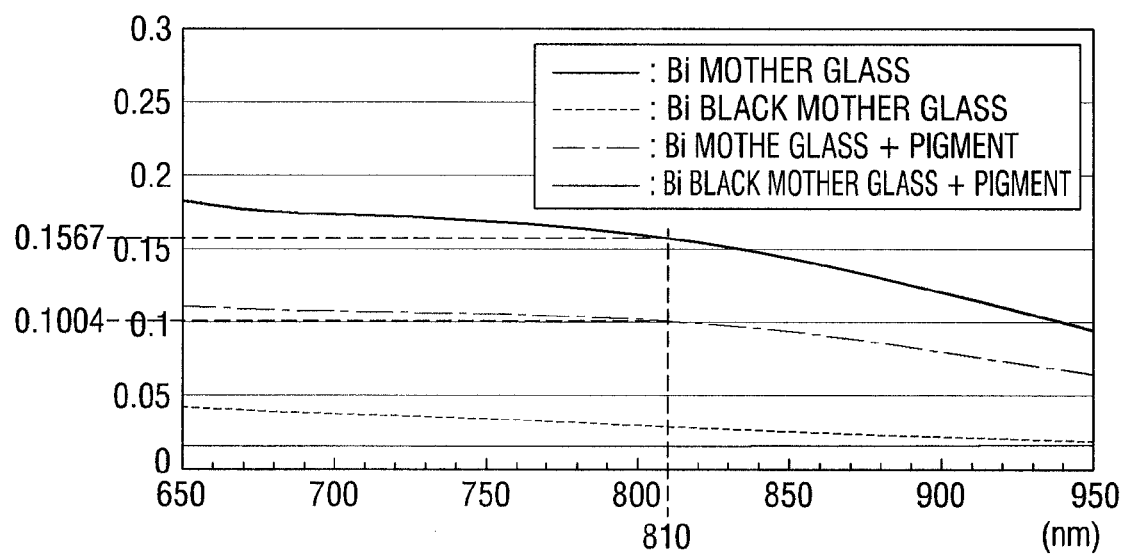
FIG. 11 is a graph illustrating an optical density range of a bismuth-based frit which is required for laser sealing.

Referring to Table 2 and FIG. 11, the optical density of the 'Bi mother glass' sample was close to zero. Although the 'Bi Black mother glass' sample showed a higher optical density than the 'Bi mother glass' sample, it did not have an effective seal width.

The 'Bi mother glass+pigment' sample had an optical density of 0.1004/μm. At this value, the 'Bi mother glass+pigment' sample had a seal width for connecting both substrates, but not an effective seal width.

The 'Bi Black mother glass+pigment' sample had an optical density of 0.1567 μm and thus an effective seal width.

As apparent from the above results, when the 'Bi Black mother glass+pigment' sample is used as a frit for a display panel, a minimum optical density of 0.1567/μm is required to form an effective seal width for connecting and sealing both substrates of the display panel.

In concluding the detailed description, those skilled in the art will appreciate that many variations and modifications can be made to the preferred embodiments without substantially departing from the principles of the present embodiments. Therefore, the disclosed preferred embodiments are used in a generic and descriptive sense only and not for purposes of limitation.

What is claimed is:

1. A display panel comprising:
    a first substrate;
    a second substrate facing the first substrate; and
    a frit bonding the first substrate and the second substrate together,
    wherein the frit has an optical density of more than about 0.0683/μm for laser light of any one wavelength in a wavelength range of about 760 to about 860 nm;
    wherein when a maximum width of the frit is D, when the width of the frit in a region in which the frit contacts the first substrate is d1, when the width of the frit in a region in which the frit contacts the second substrate is d2, and wherein d1 is defined as a seal width of the frit, a ratio of the seal width of the frit to D is about 0.7 or more; and wherein d2 and D are substantially equal.

2. The display panel of claim 1, wherein when a width of the frit in a region in which the frit contacts the first substrate is d1, when a width of the frit in a region in which the frit contacts the second substrate is d2, and when a smaller value of d1 and d2 is defined as a seal width of the frit, the seal width of the frit is about 420 to about 600 µm.

3. The display panel of claim 1, wherein the frit comprises vanadium-based mother glass.

4. The display panel of claim 3, wherein the frit comprises about 40 to about 50% by mole of $V_2O_5$.

5. The display panel of claim 3, wherein the frit further comprises $V_2O_4$.

6. The display panel of claim 5, wherein the frit is brownish in color.

7. The display panel of claim 3, wherein the frit further comprises filler and a pigment which contains one or more materials selected from the group consisting of $MnO$, $MnO_2$, and $Mn_3O_4$.

8. The display panel of claim 1, wherein the frit comprises bismuth-based mother glass, and the frit has an optical density of about 0.1567/µm or greater.

9. The display panel of claim 8, wherein the frit comprises filler and a pigment which contains one or more materials selected from the group consisting of $MnO$, $MnO_2$, and $Mn_3O_4$.

10. The display panel of claim 9, wherein content of the pigment is about 9.9 to about 11.01% by mole.

11. The display panel of claim 10, wherein the frit comprises about 30 to about 45% by mole of $Bi_2O_3$.

* * * * *